United States Patent
Huang et al.

(10) Patent No.: US 11,455,266 B2
(45) Date of Patent: Sep. 27, 2022

(54) UNIVERSAL SERIAL BUS DEVICE AND HOST

(71) Applicant: REALTEK SEMICONDUCTOR CORPORATION, Hsinchu (TW)

(72) Inventors: Zhen-Ting Huang, Hsinchu (TW); Shih Chiang Chu, Hsinchu (TW); Er Zih Wong, Hsinchu (TW); Chun Hao Lin, Hsinchu (TW); Chia-Hung Lin, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/096,398

(22) Filed: Nov. 12, 2020

(65) Prior Publication Data
US 2022/0027299 A1 Jan. 27, 2022

(30) Foreign Application Priority Data
Jul. 27, 2020 (TW) .................................. 10912529

(51) Int. Cl.
*G06F 13/38* (2006.01)
*G06F 13/42* (2006.01)
*G06F 9/30* (2018.01)
*H03K 19/17728* (2020.01)
*G06F 5/12* (2006.01)

(52) U.S. Cl.
CPC .............. *G06F 13/382* (2013.01); *G06F 5/12* (2013.01); *G06F 9/30101* (2013.01); *G06F 13/4282* (2013.01); *H03K 19/17728* (2013.01); *G06F 2213/0042* (2013.01)

(58) Field of Classification Search
CPC ....................................................... G06F 30/20
See application file for complete search history.

(56) References Cited

U.S. PATENT DOCUMENTS

| | | | |
|---|---|---|---|
| 8,625,604 B2 * | 1/2014 | Bando | H04L 45/745 370/395.31 |
| 8,762,534 B1 * | 6/2014 | Hong | G06F 9/505 709/226 |
| 9,553,809 B2 * | 1/2017 | Sorenson, III | H04L 47/10 |
| 2019/0141041 A1 * | 5/2019 | Bhabbur | H04L 9/3213 |

* cited by examiner

*Primary Examiner* — Henry Tsai
*Assistant Examiner* — Juanita Borromeo
(74) *Attorney, Agent, or Firm* — WPAT, P.C., Intellectual Property Attorneys; Anthony King

(57) ABSTRACT

A universal serial bus (USB) device includes a first storage device, a controller, and a second storage device. The first storage device is configured to store input packets to be transmitted to a USB host. The controller is configured to receive the input packets of the first storage device, respectively compute hash values of the input packets, and respectively label first identifiers in the input packets according to the hash values to correspond to one of cores of a central processing unit at the USB host end. Among the input packets, the input packets with the same hash value are labeled with the same first identifier. The second storage device is configured to store the input packets that are labeled with the first identifier. The controller is further configured to allow the input packets stored in the second storage device to be transmitted to the USB host.

20 Claims, 2 Drawing Sheets

UNIVERSAL SERIAL BUS DEVICE AND HOST

CROSS-REFERENCE TO RELATED APPLICATIONS

This application claims the benefit of priority to Patent Application 109125294, filed in Taiwan on Jul. 27, 2020, which is incorporated by reference in its entirety.

TECHNICAL FIELD

The present application relates to a universal serial bus (USB) device and host; in particular, to a USB device and host that transmits packets according to a packet identifier.

BACKGROUND

In the current technology, when packets transmitted by universal serial bus (USB) are processed by the central processing unit (CPU), the USB host assigns USB packets to any core in the CPU using the existing allocation method. However, the USB host is unable to allocate the USB packets with internet packets in a balanced way using the existing allocation method. Therefore, the CPU does not balance the load allocation of USB packets with internet packets that are transmitted from the USB. Besides, when multiple similar packets have the same source and destination addresses on the transmission control protocol, they may be assigned to different cores for computation. As a result, when the CPU processes these packets, in addition to the computation, more efforts are required to perform the input/output work to match the similar packets that are assigned to different cores.

SUMMARY OF THE INVENTION

Some embodiments of the present disclosure provide a universal serial bus (USB) device which includes a first storage device, a controller, and a second storage device. The first storage device is configured to store a plurality of input packets to be transmitted to a USB host. The controller is configured to receive the plurality of input packets of the first storage device, respectively compute a plurality of hash values of the plurality of input packets, and respectively label a plurality of first identifiers in the plurality of input packets according to the plurality of hash values to correspond to one of a plurality of cores of a central processing unit at the USB host end. Among the plurality of input packets, the input packets with the same hash value are labeled with the same first identifier. The second storage device is configured to store the plurality of input packets that are labeled with the first identifier. The controller is further configured to allow the plurality of input packets stored in the second storage device to be transmitted to the USB host.

Some embodiments of the present disclosure provide a USB host which includes a storage device and a controller. The storage device includes a plurality of endpoint buffers. The plurality of endpoint buffers are configured to store a plurality of output packets to be transmitted to a USB device. The plurality of output packets are received by a plurality of cores of a central processing unit. Each of the plurality of output packets has a first identifier corresponding to one of the plurality of cores. The controller is configured to allocate the plurality of output packets to the plurality of endpoint buffers according to the plurality of first identifiers for storage. The output packets with the same first identifier are stored in a same endpoint buffer.

Some embodiments of the present disclosure provide a USB host which includes a storage device and a controller. The storage device includes a plurality of endpoint buffers. The plurality of endpoint buffers are configured to store a plurality of input packets received from a USB device. Each of the plurality of input packets has a first identifier corresponding to one of a plurality of cores of a central processing unit. The controller is configured to assign the plurality of input packets to the plurality of cores according to the plurality of first identifiers. The plurality of first identifiers are stream identifiers.

The present USB devices and hosts are able to balance the load for processing the USB pockets.

BRIEF DESCRIPTION OF THE DRAWINGS

Aspects of the present disclosure are best understood from the following detailed description when read with the accompanying drawings. It is noted that, in accordance with the standard practice in the industry, various features are not drawn to scale. In fact, the dimensions of some features may be arbitrarily increased or reduced for clarity of discussion.

DETAILED DESCRIPTION

Figure 1:
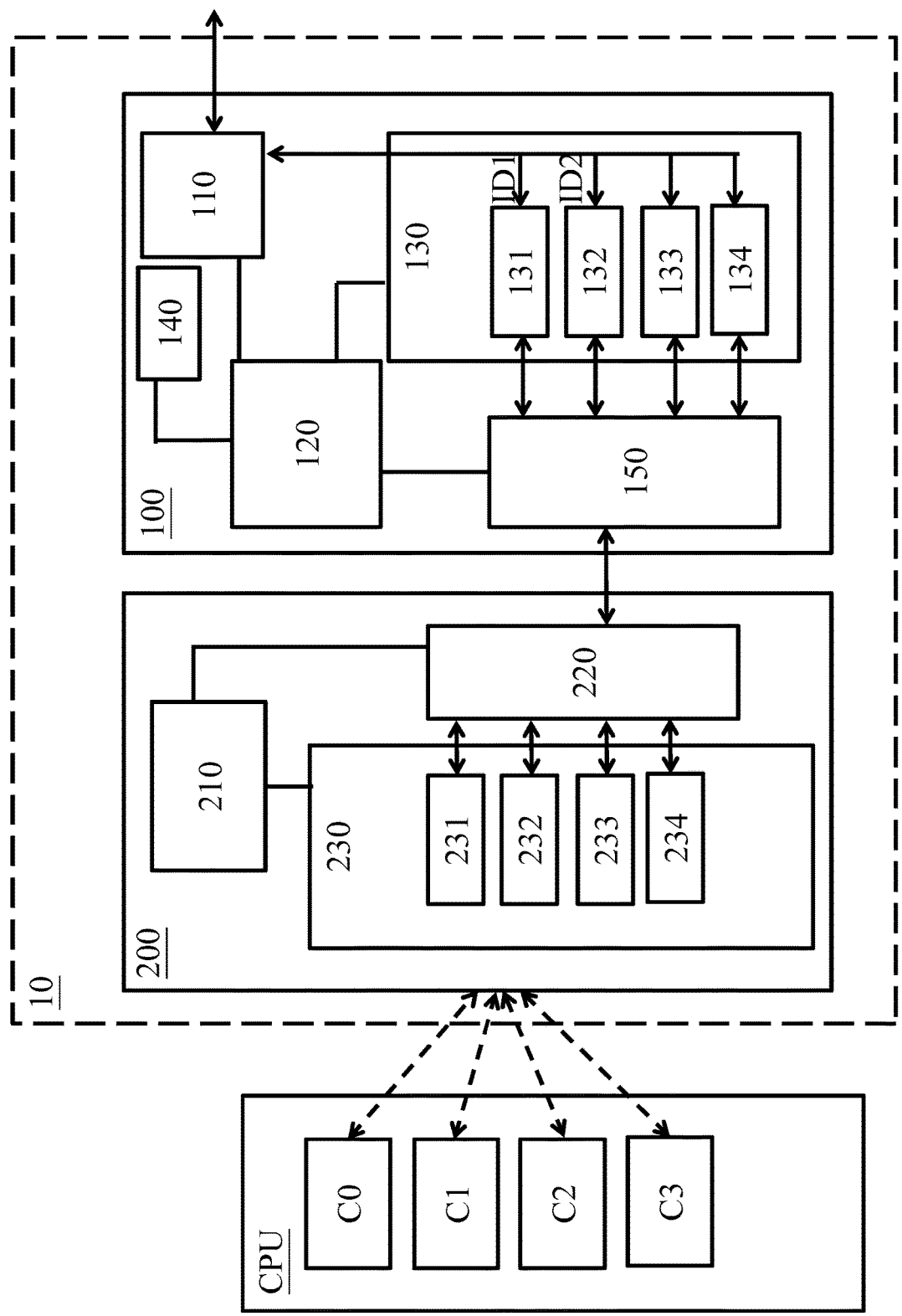
FIG. 1 is a schematic diagram illustrating a USB system according to some embodiments of the present disclosure.

Referring to FIG. 1. The universal serial bus (USB) system 10 of the present disclosure can categorize packets, and assign the packet to one of a plurality of cores C0~C3 in the central processing unit CPU according to the categories, thereby achieving the goal of load balancing; detailed discussion is provided below.

During the USB transmission, when a plurality of packets are to be transmitted from a USB device 100 to a USB host 200, the USB device 100 will categorize the plurality of packets and then transmit the packets to the USB host 200. Next, the USB host 200 assigns the packet to cores C0~C3 in the CPU according to the packet type. After the CPU finishes processing the assigned packets, it can transmit the packets back to the USB host 200. The USB host 200 then transmits the processed packets to the USB device 100.

In some embodiments, the USB device 100 and the USB host 200 are compliance with the USB 3.0 or later standard. In some embodiments, the packets are internet packets compatible with the Transmission Control Protocol (TCP). In some other embodiments, the packets are internet packets compatible with the User Datagram Protocol (UDP).

As shown in FIG. 1, the USB device 100 includes a storage device 110, a controller 120, a storage device 130, a storage device 140, and a multiplexer 150. The controller 120 is coupled with the storage device 110, the storage device 130, the storage device 140, and the multiplexer 150, respectively, to control the operation of these devices.

When a plurality of packets are to be transmitted from the USB device 100 to the USB host 200, the plurality of packets first enters the storage device 110. In some embodiments, the storage device 110 is a first in first out (FIFO) register, and the storage device 110 sequentially stores the plurality of packets that it received. When the storage device 110 outputs the plurality of packets, it also sends out the packets sequentially.

When the plurality of packets are stored in the storage device 110, the controller 120 categorizes the plurality of packets. In the present embodiment, the controller 120 performs hash function computation on the plurality of packets to obtain a hash value of each packet and then labeled the respective hash value of each packet in said packet. Generally, each packet includes a header and data, wherein the header may include information fields such as the "source address," "destination address," "topic," and "time" of the packet. In some embodiments, the controller 120 first extracts the information from some of the information fields of the packet to define the content that is subject to hash function computation, and then performs hash function computation on the defined information content. For example, the controller 120 extracts the information of "source address" and "destination address" in the packet header as the content subject to hash function computation, and then performs hash function computation on the information of "source address" and "destination address" in the header to obtain a hash value. Since the hash function is an injective function (or one-to-one function), a plurality of packets with the same "source address" and "destination address" will be computed to have the same hash value, whereas packets with different "source addresses" and "destination addresses" will be computed to have different hash values. For example, all packets generated by a specific program have the same "source address" and "destination address," and hence, all packets generated by this program has the same hash value.

In some embodiments, the controller 120 labels the thus-computed hash value in the packet. For instance, the hash value is labeled in a pre-determined blank filed in the packet header.

A lookup table is stored in the storage device 140 which records the correspondence between the hash value and the identifier ID, and hence, the controller 120 can retrieve the identifier ID of the plurality of packets according to the lookup table, and then label the identifier ID in the respective packet, such as in the header of the packet, blank filed of the packet, or any recognizable location in the packet. The identifier ID is associated with the cores C0~C3 in the CPI. Specifically, a plurality of packets with the same hash value are labeled with the same identifier ID, and thereafter, the USB host 200 will assign the same to the corresponding core in the CPU for subsequent computation. One advantage of this approach is that packets of the same type can be executed by the same core in the CPU without being interrupted, thereby increasing the computation efficiency. In the present embodiment, the identifier ID is a stream identifier defined in the USB 3.0 or later standard. The storage device 140 in FIG. 1 is a data register. In some other embodiments, the storage device 140 may be a memory device external to the USB device 100 (such as a flash memory external to the USB device 100).

Next, the controller 120 controls the storage device 130 to store the plurality of packets that have been labeled with the identifier ID. In the embodiment of FIG. 1, the storage device 130 includes a plurality of FIFO registers 131~134. The controller 120 assigns the plurality of packets to the FIFO register 131~134 for storage according to the identifier ID, and packets with the same identifier ID will be assigned to the same FIFO register. For instance, there are m packets from a first specific program and n packets from a second specific program are randomly stored in the storage device 110, and after the categorizing by the controller 120, said m packets from the first specific program are labeled with the same identifier ID1 and assigned to the FIFO register 131 for storage; whereas said n packets from the second specific program are labeled with the same identifier ID2 and assigned to the FIFO register 132 for storage.

In some embodiments, the storage device 110 and the storage device 130 are integrated into a single storage device and share the storage volume therein.

The controller 120 then controls the storage device 130 to transmit the stored packet to the multiplexer 150. The controller 120 further controls the multiplexer 150 to selectively transmit the packet to the USB host 200; for example, the controller 120 can selectively transmit a plurality of packets having a particular identifier ID to the USB host 200 first, instead of using the conventional means in which the packets are transmitted to the USB host 200 solely based on the order in which the packets enter the storage device 110. The plurality of FIFO registers 131~134 shown in FIG. 1 are arranged in parallel so that the order in which the packets are transmitted to the USB host 200 can be adjusted according to the urgency of each type of packet to be processed.

Figure 2:
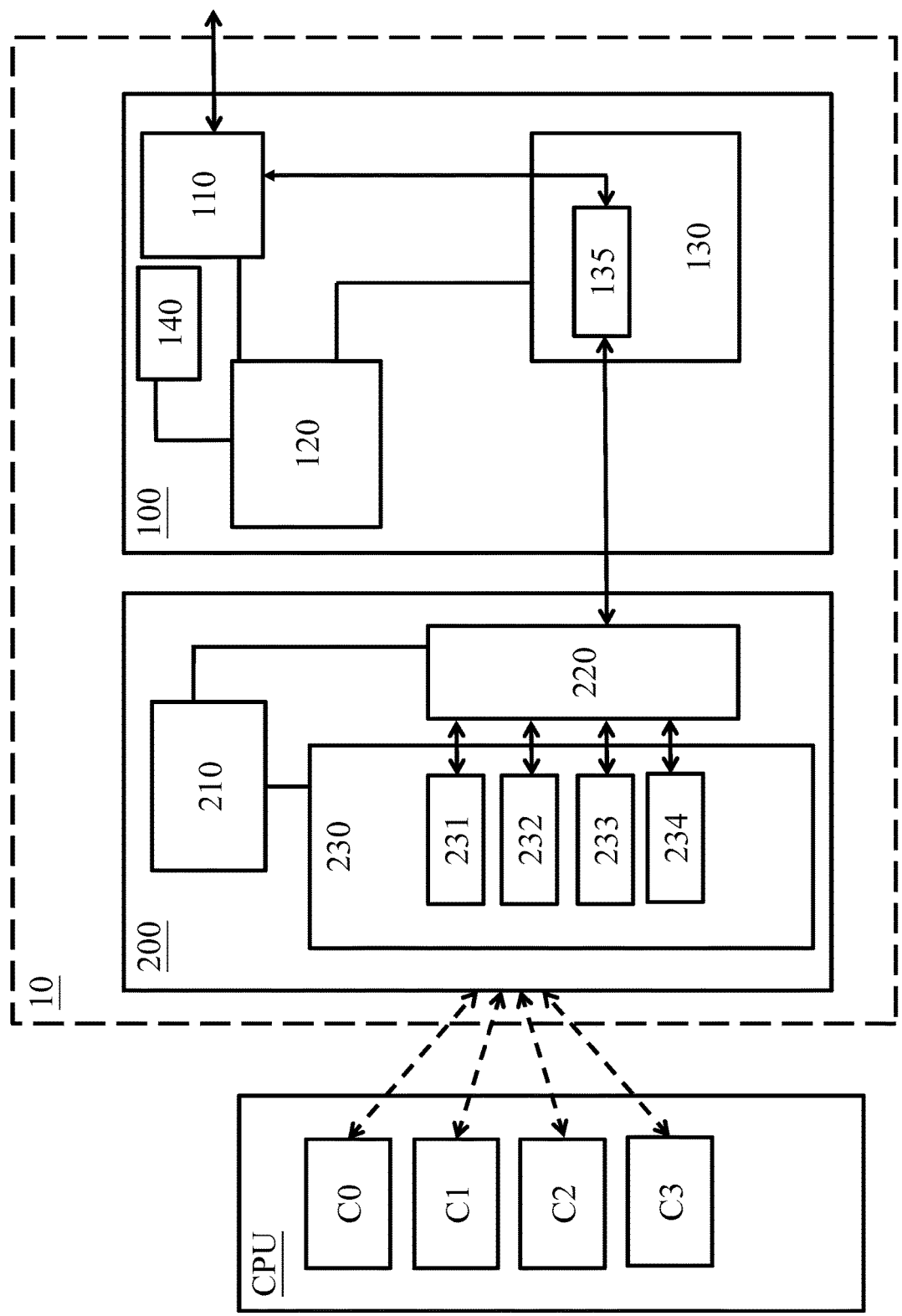
FIG. 2 is a schematic diagram illustrating a USB system according to some embodiments of the present disclosure.

In some embodiments, as shown in FIG. 2, the storage device 130 of the USB device 100 only includes a single FIFO register 135. Therefore, the plurality of packets labeled with the identifier ID are sequentially stored in the single FIFO register 135 of the storage device 130, and then read out from the single FIFO register 135 of the storage device 130 and transmitted to the USB host 200.

The USB host 200 shown in FIG. 1 is the same as the one shown in FIG. 2, both including a controller 210, a multiplexer 220, and a storage device 230. The controller 210 is coupled with the multiplexer 220 and the storage device 230, respectively.

When the plurality of packets are transmitted to the USB host 200, the controller 210 controls the multiplexer 220 to transmit the received packets to the storage device 230. In the present embodiment, the storage device 230 includes a plurality of endpoint buffers 231~234, and the controller 210 allocates packets with the same identifier ID to the same endpoint buffer for storage. The USB host 200 further assigns the packet stored in the storage device 230 to the cores C0~C3 in the CPU for computation.

When the controller 210 supports the assignment of packets to corresponding CPU cores according to the identifier ID, the controller 210 makes the USB host 200 send out an interrupt signal and/or request to the corresponding core in the CPU according to identifier ID, and then transmits the packet to corresponding cores. When the controller 210 does not support the assignment of packets to corresponding CPU cores according to the identifier ID, the USB host 200 attains the above-mentioned function by using a driver, such as using the deferred procedure call (DPC).

Therefore, packets with the same identifier ID will be assigned to the same core for computation. In some traditional practices, the USB host randomly assigns packets with the same identifier ID to any of the cores C0~C3 in the CPU for computation. Before transmitting them to the CPU, the content stored in the cache memory of each assigned core C0~C3 may need to be updated to perform operations of computation on certain types of packets. Therefore, if the same core is frequently switched between the computations on different types of packets, it will take a lot of time. Compared with such traditional practices, the USB host 200 assigns packets with the same identifier ID to the same core for computation, which can greatly reduce the burden on the CPU.

Further, in other conventional practices, the USB host only assigns all packets to the same core, resulting in a situation where a single core is overloaded while other cores are idle, thereby lengthening the overall computation time. For example, if a network card is connected to a USB host via a USB device, in the conventional practice, the USB host assigns all the packets transmitted by the network card to a single core (i.e., not assigning them to different cores at all), and if the network card has high bandwidth such as 5 GbE, the same core must handle 5G data. When the load capacity of that core is lower than 5G, the packet transmission of the network card will create a bottleneck in that core, which will cause a delay, and hence multiple cores C0~C3 in the CPU are not used efficiently. In the present disclosure, the USB host 200 has the function of assigning packets to specific cores, which can evenly allocate the burden of core C0~C3, thereby increasing the CPU efficiency and reducing the overall computation time.

After the CPU completes the processing, the plurality of packets are transmitted back to the USB host 200, and the controller 210 allows the endpoint buffers 231~234 to correspondingly store the plurality of packets according to the identifier ID so that the packets with the same identifier ID are stored in the same endpoint buffers 231~234. Since the CPU does not change the identifier ID of the plurality of packets, when one packet is stored in the endpoint buffers 231 before being transmitted into the CPU, then the packet will also be stored in the endpoint buffers 231 after being transmitted to the USB host 200 from the CPU.

Next, the controller 210 transmits the packets in the endpoint buffers 231~234 to the multiplexer 220, and then the multiplexer 220 outputs the packets to the USB device 100.

In the embodiment shown in FIG. 1, after the multiplexer 150 in the USB device 100 receives the packets from the USB host 200, the controller 120 stores the packets in the FIFO registers 131~134 according to identifier ID. Since the identifier ID remains unchanged, the packets are also stored in the same the FIFO registers 131~134. For example, when one packet is stored in the FIFO register 131 before being transmitted to the USB host 200, then after the packet is transmitted back to the USB device 100 from the USB host 200, the packet is also stored in the FIFO register 131.

In the embodiment shown in FIG. 2, since the storage device 130 only has a single FIFO register 135, all packets are sequentially stored in the FIFO register 135 of the storage device 130.

The controller 120 then controls the storage device 130 to transmit the packets to the storage device 110. Last, the packets are outputted from the storage device 110.

The foregoing outlines features of several embodiments so that those skilled in the art may better understand various aspects of the present disclosure. Those skilled in the art should appreciate that they may readily use the present disclosure as a basis for designing or modifying other processes and structures for carrying out the same purposes and/or achieving the same advantages of embodiments introduced herein. Those skilled in the art should also realize that such equivalent embodiments still fall within the spirit and scope of the present disclosure, and they may make various changes, substitutions, and alterations thereto without departing from the spirit and scope of the present disclosure.

What is claimed is:

1. A universal serial bus (USB) device, comprising:
a first storage device, configured to store a plurality of input packets to be transmitted to a USB host;
a controller, configured to receive the plurality of input packets of the first storage device, respectively compute a plurality of hash values of the plurality of input packets, and respectively label a plurality of first identifiers in the plurality of input packets according to the plurality of hash values to correspond to one of a plurality of cores of a central processing unit at the USB host external to the USB device, wherein among the plurality of input packets, the input packets with the same hash value are labeled with the same first identifier; and
a second storage device, configured to store the plurality of input packets that are labeled with the first identifier, wherein, the controller is further configured to allow the plurality of input packets stored in the second storage device to be transmitted to the USB host.

2. The USB device of claim 1, further comprising:
a third storage device, configured to store a lookup table, wherein the lookup table provides a correspondence between the plurality of hash values and the plurality of first identifiers, wherein the plurality of first identifiers are associated with the plurality of cores,
wherein the controller labels the plurality of first identifiers in the plurality of input packets according to the correspondence.

3. The USB device of claim 1, wherein the second storage device comprises:
a plurality of first in first out (FIFO) registers, wherein the controller further controls each FIFO register to store input packets with the same first identifier.

4. The USB device of claim 3, wherein the second storage device is further configured to store a plurality of output packets transmitted from the USB host, wherein each of the plurality of output packets has a second identifier, wherein the controller is further configured to allocate the plurality of output packets to the plurality of FIFO registers according to the plurality of second identifiers for storage.

5. The USB device of claim 4, wherein the plurality of second identifiers are stream identifiers.

6. The USB device of claim 4, wherein each FIFO register is configured to store output packets with the same second identifier.

7. The USB device of claim 1, wherein the second storage device is a first in first out (FIFO) register, wherein the controller is further configured to control the FIFO register to sequentially store the plurality of output packets transmitted from the USB host.

8. The USB device of claim 1, wherein the plurality of first identifiers are stream identifiers.

9. A universal serial bus (USB) host, comprising:
a storage device, comprising a plurality of endpoint buffers, wherein the plurality of endpoint buffers are configured to store a plurality of output packets to be transmitted to a USB device, wherein the plurality of output packets are received by a plurality of cores of a central processing unit external to the USB device, wherein each of the plurality of output packets has a first identifier corresponding to one of the plurality of cores; and
a controller, configured to allocate the plurality of output packets to the plurality of endpoint buffers according to the plurality of first identifiers for storage, wherein the output packets with the same first identifier are stored in a same endpoint buffer.

10. The USB host of claim 9, wherein the plurality of first identifiers are stream identifiers.

11. The USB host of claim 9, wherein the plurality of endpoint buffers are further configured to store a plurality of input packets transmitted from the USB device, wherein each of the plurality of input packets has a second identifier, wherein the controller is further configured to allocate the plurality of input packets to the plurality of endpoint buffers according to the plurality of second identifiers for storage.

12. The USB host of claim 11, wherein the controller is further configured to respectively assigns the plurality of input packets to the plurality of cores according to the plurality of second identifiers.

13. The USB host of claim 11, wherein the controller is further configured to assign the plurality of input packets to the plurality of cores by using a driver.

14. The USB host of claim 11, wherein the plurality of input packets are processed by the plurality of cores into the plurality of output packets, respectively, wherein the second identifiers of the plurality of input packets and the first identifiers of the plurality of corresponding output packets are the same.

15. The USB host of claim 11, wherein the input packets with the same second identifier are allocated to the same endpoint buffer.

16. A universal serial bus (USB) host, comprising:
a storage device, comprising a plurality of endpoint buffers, wherein the plurality of endpoint buffers are configured to store a plurality of input packets received from a USB device, wherein each of the plurality of input packets has a first identifier corresponding to one of a plurality of cores of a central processing unit external to the USD device; and
a controller, configured to assign the plurality of input packets to the plurality of cores according to the plurality of first identifiers,
wherein the plurality of first identifiers are stream identifiers.

17. The USB host of claim 16, wherein the controller is further configured to assign the plurality of input packets to the plurality of cores using a driver.

18. The USB host of claim 16, wherein the controller is further configured to control the plurality of endpoint buffers to store the plurality of input packets according to the plurality of first identifier, wherein the input packets with the same first identifier are stored in a same endpoint buffer.

19. The USB host of claim 16, wherein the plurality of input packets are processed by the plurality of cores into a plurality of output packets, respectively, wherein each of the plurality of output packets has a second identifier,
wherein the controller is further configured to control the plurality of endpoint buffers to store the plurality of output packets with the same second identifier.

20. The USB host of claim 19, wherein the plurality of first identifiers of the plurality of input packets and the plurality of second identifiers of the corresponding output packets are the same.

* * * * *